(12) United States Patent
Tarutani

(10) Patent No.: US 6,755,579 B2
(45) Date of Patent: Jun. 29, 2004

(54) DEVELOPER HAVING SUBSTRATE OSCILLATING SYSTEM AND METHOD OF DEVELOPING PROCESS

(75) Inventor: Shinji Tarutani, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/309,247

(22) Filed: Dec. 4, 2002

(65) Prior Publication Data

US 2004/0009432 A1 Jan. 15, 2004

(30) Foreign Application Priority Data

Jul. 15, 2002 (JP) .................................. P2002-205107

(51) Int. Cl.$^7$ .......................... G03D 5/04; B08B 3/00; B05C 11/02
(52) U.S. Cl. ...................... 396/611; 396/633; 396/635; 134/140; 134/153; 134/161; 118/52; 118/57
(58) Field of Search ................................ 396/611, 633, 396/635; 134/140, 153, 161; 118/52, 57

(56) References Cited

U.S. PATENT DOCUMENTS

| 4,502,772 A | * | 3/1985 | Mihara | ........................ 396/635 |
| 5,930,549 A | * | 7/1999 | Kim et al. | .................. 396/611 |

FOREIGN PATENT DOCUMENTS

| JP | 11-121596 | 4/1999 |
| JP | 2001-307994 | 11/2001 |

* cited by examiner

Primary Examiner—Richard L. Schilling
(74) Attorney, Agent, or Firm—Oblon, Spivak, McClelland, Maier & Neustadt, P.C.

(57) ABSTRACT

A developer and a method of a developing process which improve upon uniformity in a size of a resist pattern are provided.

The developer includes a wafer rotating system (10) and a wafer oscillating system (20) which oscillates whole of the wafer rotating system (10) in one-dimensional direction, and the wafer oscillating system (20) has a motor supporting part (4) which mounts and fixes a motor part (1), a rail (5) which engages a rail groove (41) formed on a bottom side of the motor supporting part (4) and also enables the motor supporting part (4) to slide smoothly in one-dimensional direction, a guide bar (6) which is coupled with the motor part (1) and transmits a propulsion which enables the motor part (1) to slide along the rail (5) and a linear motor part (7) which engages the guide bar (6) and is a propulsion supplying source which supplies the propulsion with the wafer rotating system (10) by sliding the guide bar (6) in the axial direction of the guide bar (6).

3 Claims, 3 Drawing Sheets

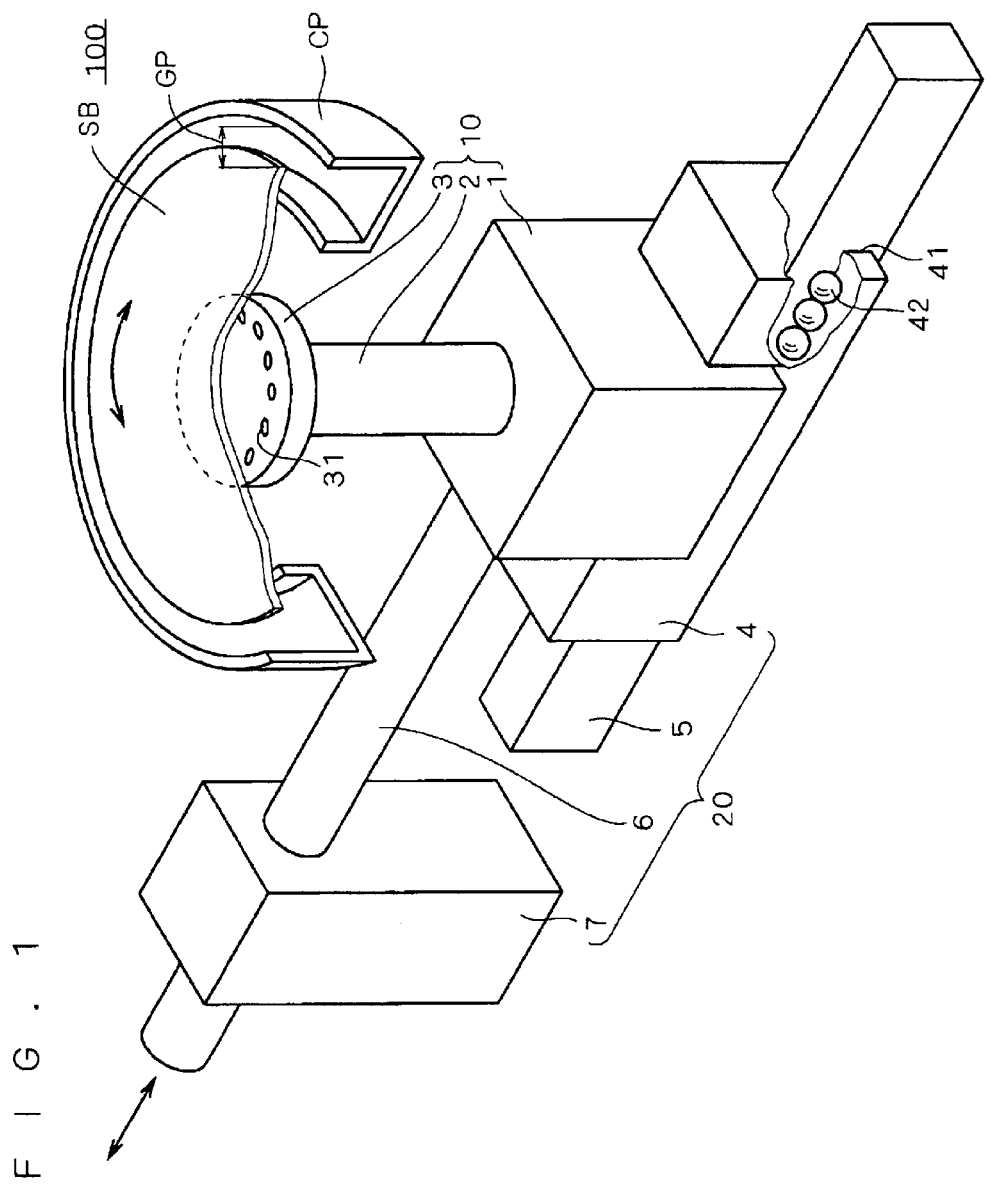
F I G. 1

DEVELOPER HAVING SUBSTRATE OSCILLATING SYSTEM AND METHOD OF DEVELOPING PROCESS

BACKGROUND OF THE INVENTION

1. Field of the Invention

The present invention relates to a developer and a method of a developing process of a resist pattern in a photolithography process.

2. Description of the Background Art

Conventional developing process of a resist pattern in the photolithography, which is one of steps of manufacturing a semiconductor device, is described employing a flow chart in FIG. 3.

First, in a step S1, a semiconductor wafer is coated with a resist material, and afterwards, an exposure is performed employing a certain exposure mask, and a pattern of the exposure mask is printed (a step S2).

Next, in a step S3, in advance of a developing process, a Post Exposure Bake process is performed on the semiconductor wafer.

Afterwards, in a step S4, a temperature of the semiconductor wafer is cooled down approximately to a room temperature.

Next, in a step S5, the semiconductor wafer which the pattern is printed on is mounted on a turntable of a developer, and a developing solution is uniformly dropped on the semiconductor wafer, and afterwards, the developing solution on the semiconductor wafer is agitated by means of a rotation of the semiconductor wafer at a velocity of 10 rpm, approximately for 0.5 seconds in every 5 to 6 seconds (a step S6).

Next, in a step S7, the semiconductor wafer is rinsed with a pure water while being rotated, and afterwards, in a step S8, the semiconductor wafer is dried up and then the serial steps of the developing end.

Here, in the step S6, the developing solution is agitated preventing the defect in the developing. That is, solubility and a velocity of dissolution of the resist into the developing solution vary according to the sort of the resist. Accordingly, as for a static developing, in which the developing is performed with the semiconductor wafer remaining halting after dropping the developing solution on the semiconductor wafer, the developing solution on the resist remains halting. Therefore, on a surrounding of an interface where the resist and the developing solution come in contact with each other, the dissolved resist accumulates and this causes low solubility, and on the other hand, as for the resist of slow solubility, the phenomenon occurs that the behavior of the developing differs between the part where the resist dissolves much (that is, in the positive type resist, the part which has a large exposed area) and the part where the resist dissolves little (that is, in the positive type resist, the part which has a small exposed area) per unit area. This may cause lack of uniformity in the size of the resist pattern or an occurrence of a resist scum. By contrast, when the developing solution is agitated, the developing solution on the interface where the resist and the developing solution come in contact with each other is refreshed, and thus the behavior of the developing can be improved.

As described above, conventionally, the semiconductor wafer is intermittently and slightly rotated for the purpose of agitating the developing solution, however in this method, a migration length per unit time differs between the center and the periphery of the semiconductor wafer (the closer the periphery comes, the more the migration length increases), and thus a flow rate of the developing solution on the semiconductor wafer varies according to a distance from the center of the semiconductor wafer, and the problem remains in that the size of the resist pattern is not always uniform.

SUMMARY OF THE INVENTION

The present invention is to provide a developer and a method of a developing process which improve upon uniformity in a size of a resist pattern.

An aspect of a developer according to the present invention includes a substrate rotating system which rotates a substrate of an object of a developing process in-plane and a substrate oscillating system which oscillates the substrate in one-dimensional direction paralleled with a main surface of the substrate by means of oscillating whole of the substrate rotating system in one-dimensional direction. Further, the substrate oscillating system includes a movable supporting part which supports the substrate rotating system, a rail which guides the supporting part to move in one-dimensional direction, and a propulsion supplying source which supplies the propulsion to slide the supporting part along the rail.

According to the developer described above, the substrate oscillating system includes the rail which guides the movable supporting part to move in one-dimensional direction and also slides the supporting part along the rail, therefore, enables the substrate to oscillate in one-dimensional direction paralleled with the main surface of the substrate smoothly with no backlash.

An aspect of a method of a developing process according to the present invention is that it is a method of a developing process of a resist which coats the substrate and also includes steps (a) and (b) described below. That is, this method includes a step (a) indicating exposing after coating the substrate with a resist, and dropping a developing solution uniformly on an entire surface of the substrate and a step (b) indicating agitating the developing solution by means of oscillating the substrate on which the developing solution is dropped in one-dimensional direction paralleled with the main surface of the substrate.

According to the method of the developing process described above, the developing solution on the interface where the resist and the developing solution come in contact with each other is refreshed by means of agitating the developing solution by oscillating the substrate in one-dimensional direction paralleled with the main surface, and thus the behavior of the developing can be improved. Further, the substrate is oscillated in one-dimensional direction, so that a migration length in the entire surface of the substrate per unit time can be uniformed, a phenomenon does not occur that the flow rate of the developing solution on the substrate varies according to the location, the developing solution is refreshed uniformly, the behavior of the developing can be unified, and thus uniformity in the size of the resist pattern can be still improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view for describing a formation of a developer according to a preferred embodiment of the present invention.

DESCRIPTION OF THE PREFERRED EMBODIMENTS

Figure 2:
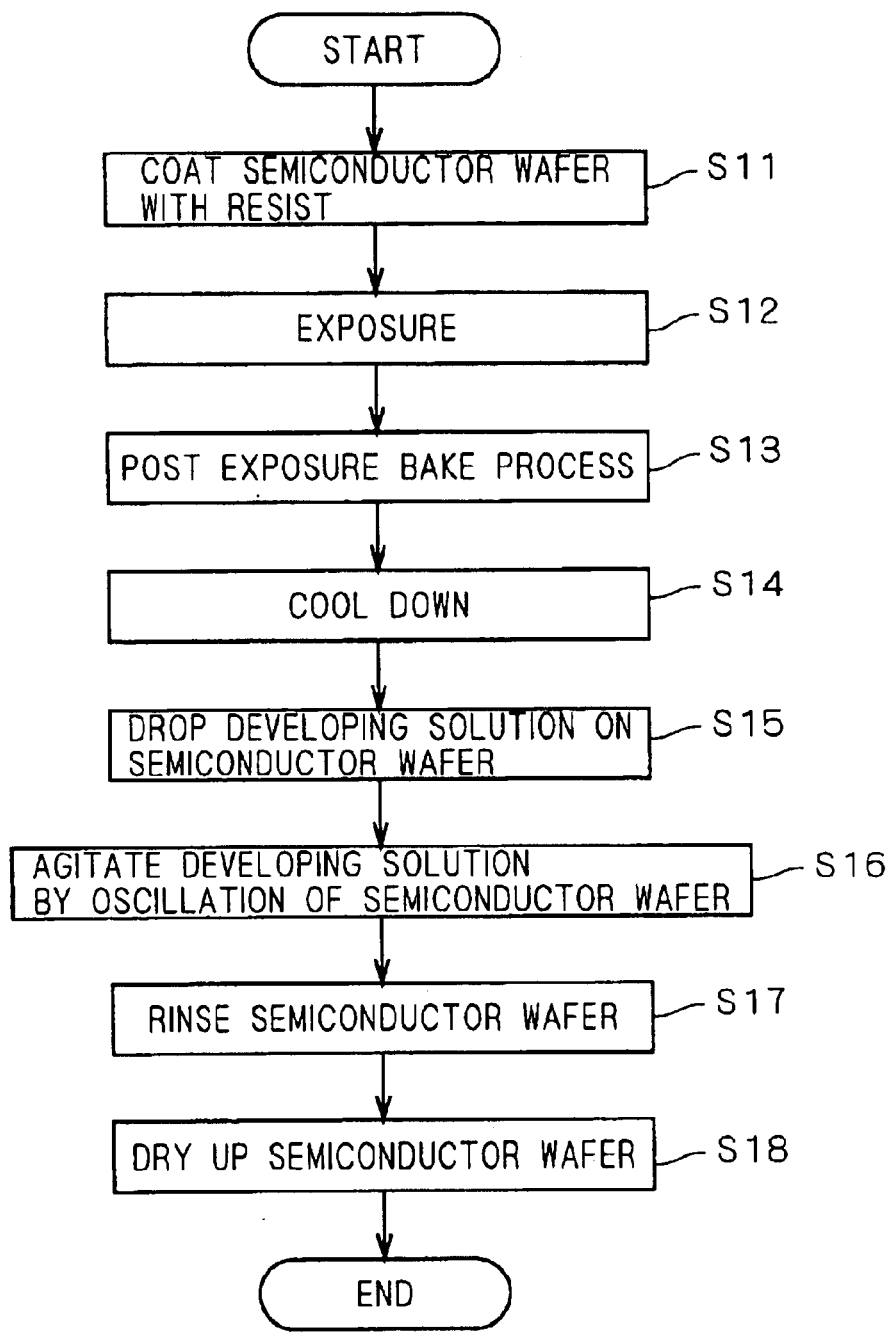
FIG. 2 is a flow chart for describing a method of a developing process according to a preferred embodiment of the present invention.
Figure 3:
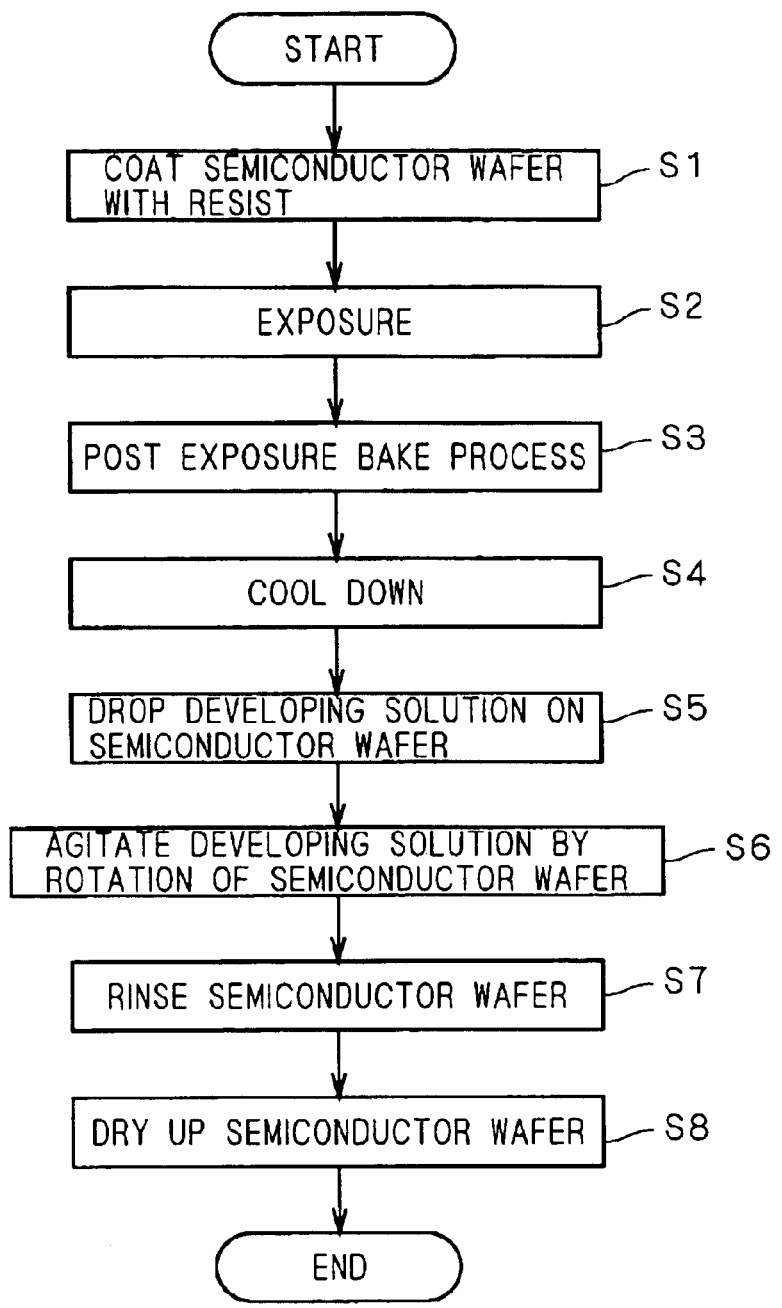
FIG. 3 is a flow chart for describing a conventional method of a developing process.

The preferred embodiments of the present invention will be described employing FIGS. 1 and 2.

First, a formation of a developer 100 according to a preferred embodiment of the present invention will be described employing FIG. 1.

A. A Formation of a Developer

As shown in FIG. 1, a developer 100 has a formation including a wafer rotating system 10 (a substrate rotating system) which rotates a semiconductor wafer SB in-plane and a wafer oscillating system 20 (a substrate oscillating system) which oscillates the semiconductor wafer SB in one-dimensional direction paralleled with the main surface of the semiconductor wafer SB.

The wafer rotating system 10 has a motor part 1 which is the driving source to rotate the semiconductor SB, a rotating axis 2 which is connected with the motor part 1 at one side of the axial end of the rotating axis 2, further transmits a driving force which the motor part 1 generates and still further supports the semiconductor wafer SB and a wafer chuck 3 which is connected with the rotating axis 2 at the other side of its axial end which is opposite to the side connected with the motor part 1 and vacuously sucks the semiconductor wafer SB.

The wafer oscillating system 20 includes a formation oscillating whole of the wafer rotating system 10 in one-dimensional direction, and has a motor supporting part 4 which mounts and fixes the motor part 1, a rail 5 which engages a rail groove 41 formed on a bottom side of the motor supporting part 4 and also enables the motor supporting part 4 to slide smoothly in one-dimensional direction, a guide bar 6 which is coupled with the motor part 1 and transmits a propulsion which enables the motor part 1 to slide along the rail 5 and a linear motor part 7 which engages the guide bar 6 and is a propulsion supplying source which supplies the propulsion with the wafer rotating system 10 by sliding the guide bar 6 in its axial direction. Further, the linear motor part 7 and the motor part 1 are respectively connected with a control equipment which is not shown in FIG. 1 and both the rotating operation and the oscillating operation are under the control.

The linear motor part 7 and the rail 5 are properly placed so that both the directions in which the rail 5 extends and the guide bar 6 slides become one, and the rail 5 and the linear motor part 7 are respectively arranged being fixed to a certain place.

A ball bearing 42 is inserted into the right, left and upper wall of the rail groove 41, and by bringing the ball bearing 42 into contact with the right, left and upper of the rail 5, the motor supporting part 4 can engage the rail 5 with no backlash and moreover, it is possible to slide the motor supporting part 4 smoothly along the rail 5. Further, it goes without saying that the ball bearing 42 is plurally arranged into the right, left and upper wall of the rail groove 41 along the direction in which the rail 5 extends. Still further, it goes without saying that the number of the rail 5 which engages the motor supporting part 4 is not restricted to a single, but a double or more rails are also applicable. Addition of the rails enables the motor supporting part 4 to slide more stably.

When the linear motor part 7 has a structure which enables the guide bar 6 to slide in its axial direction by an electromagnetic force, the system is not restricted, however, when a cylindrical linear motor is used in which the guide bar 6 is treated as a movable element and a cylindrical stator is placed around the guide bar 6, the structure of the linear motor part 7 can comparatively be simplified.

In a classification based on an operating principle, a linear induction motor (LIM) and a linear pulse motor (LPM) are desirable in that precision in a stop is fine (less than 1 mm). Further, as the propulsion supplying source, not restricting to a linear motor, when a system which is to convert a turning effort into a propulsion in the straight direction, for example the propulsion yielded by rotating a ball skrew is used, a rotating motor such as a pulse motor, a stepping motor and so on is also applicable.

As for the wafer rotating system 10, a conventional device is applicable, however, a structure which can fix to the motor supporting part 4 is required, and moreover, in the migration of the motor part 1 in one-dimensional direction, measures such as having a flexible structure to prevent an excessive stress on an electric wire which is supplied to the motor part 1, a vacuum exhaust tube which is connected from an outside to provide a force of suction for the wafer chuck 3 and so on is to be required.

In FIG. 1, as a formation except for the wafer rotating system 10 and the wafer oscillating system 20 described above, a cup CP is shown in the outside of the peripheral portion of the semiconductor SB, arranged to surround the semiconductor wafer SB.

The cup CP is a container which works as a saucer for a waste water which is generated when a pure water from a nozzle which is not shown in FIG. 1 is supplied on the surface of the semiconductor wafer SB and a rinsing process is performed on the developing solution on the surface of the semiconductor wafer SB, and has a formation which can catch the waste water which flows down from the surface of the semiconductor wafer SB.

Concerning the oscillation of the semiconductor wafer SB, a prevention of the semiconductor wafer SB having contact with the cup CP is practicable by having a formation that the cup CP is coupled with the motor part 1 to move in the same direction linking the migration of the motor part 1 in one-dimensional direction, and is also practicable by setting up a length of a space GP between a peripheral wall of the cup CP and the semiconductor wafer SB longer than a oscillation length of the semiconductor wafer SB described hereafter.

The structure of the cup CP is not restricted to the structure shown in FIG. 1, but deepening a depth is applicable, and moreover, it is also applicable to have a formation to place a visor projected on the skew from the peripheral wall of the cup CP to the upper of the semiconductor wafer SB, however, as for the cup CP which has little relevance to the present invention, the further description will be omitted.

B. A Method of a Developing Process

Referring to FIG. 1, the method of the developing process employing the developer 100 will be described below employing a flow chart shown in FIG. 2.

First, in a step S11, the semiconductor wafer SB is coated with a resist material. Here, the resist material for coating varies according to a wavelength of an exposure light source to be used, and for using a KrF excimer laser light, the resist material called a KrF resist is used, for using a spectral light i-line of a high-pressure mercury lamp (wavelength 365 nm), the resist material called an i-line resist is used and for using a spectral light g-line of the high-pressure mercury lamp (wavelength 436 nm), the resist material called a g-line resist is used.

The substances including polyvinyl phenol, the copolymer consisting of vinyl phenol and styrene, the copolymer consisting of vinyl phenol and acrylic acid, the copolymer consisting of vinyl phenol, styrene and acrylic acid and so on are cited as the KrF resist, and the substances including novolac resin, polyvinyl phenol, the copolymer consisting of vinyl phenol and styrene and so on are cited as the i-line and g-line resist.

Next, in a step S12, an exposure is performed employing a certain exposure mask, and a pattern of the exposure mask is printed.

Next, in a step S13, in advance of the developing process, a Post Exposure Bake process is performed on the semiconductor wafer SB. This process is performed for the purpose of an improvement of sensitivity and resolution by the combination of the baking process performed before coating with the resist.

Afterwards, in a step S14, a temperature of the semiconductor wafer SB is cooled down approximately to a room temperature.

Next, in a step S15, the semiconductor wafer SB which the pattern is printed on is mounted on the wafer chuck 3 of the developer 100, and is fixed by a vacuum suction through a suction hole 31 placed in the wafer chuck 3.

Further, the developing solution is uniformly dropped on the semiconductor wafer SB by means of dropping the developing solution from the nozzle which is placed in the upper of the semiconductor wafer SB, not shown in FIG. 1.

As for the developing solutions, which are in common applicable for all of the resist materials described above, basic aqueous solutions such as tetramethyl ammonium hydroxide aqueous solution, tetraethyl ammonium hydroxide aqueous solution, tetrabuthyl ammonium hydroxide aqueous solution, ammonia aqueous solution, triethyl amine aqueous solution, trimethyl amine aqueous solution and so on can be used.

As for the method of dropping the developing solution, there is the method using a nozzle whose mouthpiece is longer than the distance across the semiconductor wafer SB and then dropping the developing solution while the nozzle is scanning in one direction on the semiconductor wafer SB, which is halted, and is also the method using the nozzle whose mouthpiece is shorter than the distance across the semiconductor wafer SB and then dropping the developing solution while the nozzle is scanning on the semiconductor wafer SB, which is rotated. Further, the method of developing process according to the present invention is applicable for any nozzle to be used, or any dropping method to be applied.

Next, in a step S16, the semiconductor wafer SB is oscillated in one-dimensional direction by sliding the guide bar 6 for a certain distance for a certain time to be predetermined and then sliding the guide bar 6 under the similar condition in the reverse direction by driving the linear motor part 7, and the developing solution on the semiconductor wafer SB is agitated.

Assuming that it takes 60 seconds for the developing, the condition of the oscillation to be supposed is that the semiconductor wafer SB is moved in one-dimensional counterpart directions by turns for 0.2 seconds in every 4.8 seconds, for example. More concretely, assuming that the migration is performed 12 times in 60 seconds, the migrations of odd turns to be supposed are that the semiconductor wafer SB is moved the distance of 5 mm in the first direction from an original point at the initial acceleration of 1000 mm/sec$^2$ and the velocity of 25 mm/sec, and the migrations of even turns to be supposed are that the semiconductor wafer SB is moved the distance of 5 mm in the second direction which is opposite to the first direction at the initial acceleration of 1000 mm/sec$^2$ and the velocity of 25 mm/sec, and then returns to the original point. Hereby, at the time of finishing the twelfth migration, the semiconductor wafer SB is supposed to return to the original point.

It is also applicable to oscillate the semiconductor wafer SB like a pendulum centering on the original point such as to move the distance of 5 mm in the first direction from the original point at the first migration, then move the distance of 5 mm in the second direction which is opposite to the first direction and return to the original point at the second migration, then move the distance of 5 mm in the second direction from the original point at the third migration and then move the distance of 5 mm in the first direction and return to the original point at the fourth migration.

As concerns the operation described above, the semiconductor wafer SB only moves within the distance of 5 mm plus or minus from the original point, therefore, as described employing FIG. 1, concerning the oscillation of the semiconductor wafer SB, the prevention of the semiconductor wafer SB having contact with the cup CP is practicable by setting up the length of the space GP between the peripheral wall of the cup CP and the semiconductor wafer SB longer than 5 mm. In applying this, it is unnecessary to have the formation which enables the cup CP to move in one-dimensional direction linking the migration of the motor part 1 by coupling the cup CP with the motor part 1, or others.

After the time for the developing elapsed, the semiconductor wafer SB returns to the original point, thus it is easy to perform the operation to remove the semiconductor wafer SB from the wafer chuck 3 by employing a robot arm and so on.

In the above description, the semiconductor wafer SB is assumed to move 5 mm in 0.2 seconds, and this corresponds to 25 mm/sec in the velocity and 62.5 mm/sec$^2$ in the acceleration. Or, not maintaining the equivalent acceleration for 0.2 seconds, but as for the initial acceleration, that is, the velocity accelerates only at the beginning of the oscillation, at 1000 mm/sec$^2$, the developing solution on the semiconductor wafer SB does not spill from the cup CP, concerning the oscillation of the semiconductor wafer SB.

The velocity and the acceleration is not restricted to the above description, and the spilth can be prevented if the oscillation is performed within 100 mm/sec in the velocity and within 10000 mm/sec$^2$ in the initial acceleration.

In the above description, the semiconductor wafer SB is assumed to oscillate in every 4.8 seconds, however, the oscillation intervals are not restricted to this. This time schedule to move the semiconductor wafer SB for 0.2 seconds in every 4.8 seconds is premised on the performance of the migration of 12 times in 60 seconds, thus when the frequency of the migration is changed, the time schedule can also be changed, for example, the time schedule to move the semiconductor wafer SB for 0.3 seconds in every 5.7 seconds is also applicable. In this case, the migration of 10 times in 60 seconds is applicable.

However, when the oscillation intervals are too long, the refresh is not performed effectively, and moreover, the behavior of the developing can not be unified, therefore, it is desirable to set up the oscillation intervals within 10 seconds.

Returning to the description of FIG. 2, in a step S17, the semiconductor wafer SB is rinsed with the pure water while being rotated, and afterwards, in a step S18, the semiconductor wafer SB is dried up and then the serial steps of the developing end.

C. The Effect of the Action

As described above, the developing solution is agitated by oscillating the semiconductor wafer SB in one-dimensional direction paralleled with the main surface, and the developing solution on the interface where the resist and the developing solution come in contact with each other is refreshed and thus the behavior of the developing can be improved. Further, the semiconductor wafer SB is oscillated in one-dimensional direction, so that a migration length in the entire surface of the semiconductor wafer SB per unit time can be uniformed, the phenomenon does not occur that the flow rate of the developing solution on the semiconductor wafer SB varies according to the location, the developing solution is refreshed uniformly, and thus the behavior of the developing can be unified. As a result, uniformity in the size of the resist pattern can be still improved.

D. Examples of Modification

In the above description, the developing of the resist which coats the semiconductor wafer is described as an example, however, the application of the present invention is not restricted to the semiconductor wafer, but it is also applicable to a liquid crystal panel and the developing to the resist concerning a patterning to a glass substrate employed for a plasma display panel (PDP) and so on, for example. In short, the present invention is applicable to the glass substrate and any other substrate, if it is the substrate on which the developing process of the resist which coats the substrate is performed.

While the invention has been shown and described in detail, the foregoing description is in all aspects illustrative and not restrictive. It is therefore understood that numerous modifications and variations can be devised without departing from the scope of the invention.

What is claimed is:

1. A developer, comprising:

a substrate rotating system configured to rotate a substrate of an object of a developing process in-plane; and a substrate oscillating system configured to oscillate said substrate in one-dimensional direction paralleled with a main surface of said substrate by oscillating whole of said substrate rotating system in the one-dimensional direction, wherein said substrate oscillating system comprises:

a movable supporting part supporting said substrate rotating system;

a rail configured to guide said supporting part to move in the one-dimensional direction; and a propulsion supplying source configured to supply a propulsion to slide said supporting part along said rail.

2. The developer according to claim 1, wherein said propulsion supplying source is a linear motor;

said linear motor engages a guide bar configured to transmit a propulsion generated; and said substrate rotating system is configured to be oscillated in the one-dimensional direction through said guide bar by sliding said guide bar in an axial direction of said guide bar.

3. The developer according to claim 2, wherein said linear motor is a cylindrical linear motor having said guide bar as a movable element and a cylindrical stator around said guide bar.

* * * * *